(12) United States Patent
Wang et al.

(10) Patent No.: US 6,838,227 B2
(45) Date of Patent: Jan. 4, 2005

(54) POLYSTYRENE AS A RESIST FOR MAKING PATTERNED MEDIA

(75) Inventors: HongYing Wang, Fremont, CA (US); Neil Deeman, Alamo, CA (US); Koichi Wago, Sunnyvale, CA (US); Nobuo Kurataka, Campbell, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 240 days.

(21) Appl. No.: 10/112,214

(22) Filed: Mar. 29, 2002

(65) Prior Publication Data

US 2003/0104316 A1 Jun. 5, 2003

Related U.S. Application Data

(60) Provisional application No. 60/337,259, filed on Nov. 30, 2001.

(51) Int. Cl.⁷ .............................. G03C 5/00; B05D 5/12; B32B 13/04

(52) U.S. Cl. .................. 430/320; 430/296; 427/129; 427/130; 427/131; 427/132; 427/259; 427/261; 427/264; 427/265; 427/272; 427/282; 427/299; 427/355; 427/404; 427/407.1; 428/221; 428/457; 428/693; 428/699; 428/900

(58) Field of Search .............................. 430/320, 221, 430/457, 693, 699, 900, 291; 427/129, 130, 131, 132, 259, 261, 264, 265, 272, 282, 355, 404, 407.1

(56) References Cited

U.S. PATENT DOCUMENTS

| | | | |
|---|---|---|---|
| 5,258,267 A | 11/1993 | Maruyama | |
| 5,707,859 A | 1/1998 | Miller et al. | |
| 5,772,905 A | 6/1998 | Chou | |
| 6,190,929 B1 | 2/2001 | Wang et al. | |
| 6,197,399 B1 | 3/2001 | Naito et al. | |
| 6,617,012 B1 * | 9/2003 | Wang et al. ................ 428/221 |

OTHER PUBLICATIONS

U.S. Appl. No. 10/112,192, filed Mar. 29, 2002, Wang.
J.A. Brydson, "Plastics Materials", 6th edition, Butterworth–Heinemann, 1995 p78 and p94, United Kingdom.

* cited by examiner

Primary Examiner—Thorl Chea
(74) Attorney, Agent, or Firm—Raghunath S. Minisandram; Jesus Del Castillo (57) ABSTRACT

A system and method for forming servo patterns on magnetic media is disclosed. A magnetic film coated with a layer of polystyrene is stamped with a nickel stamper reproducing the negative image of the stamped pattern on the polystyrene. Ions are then accelerated towards the surface of the polystyrene, which stopps the ions in the areas where the polystyrene is thick and allows the ions to penetrate through to the magnetic layer in the areas where the polystyrene is thin. The ions, which penetrate through to the magnetic layer, interact with the magnetic layer altering the magnetic layer's structure reducing its coercivity (Hc) and remnant moment (Mrt). This reproduces the stamped polystyrene pattern on the magnetic layer. The polystyrene is then removed by oxygen plasma etching the surface leaving behind a patterned magnetic media.

17 Claims, 7 Drawing Sheets

POLYSTYRENE AS A RESIST FOR MAKING PATTERNED MEDIA

This application claims priority from U.S. provisional application Ser. No. 60/337,259, filed on Nov. 30, 2001.

BACKGROUND OF THE INVENTION

1. Field of the Invention

The present invention relates generally to patterned magnetic media, and more particularly to resist used for nano-imprint lithography and subsequent ion implantation in patterned magnetic media.

2. Description of the Related Art

In the microelectronics industry, a conventional patterning process usually consists of two parts. The first part includes patterning a polymeric resist layer by lithographic methods, such as photolithography, e-beam or X-ray lithography, for mask definition. The second part includes subsequently transferring the pattern into a hard material using a process such as dry etching, wet etching, lift-off, or electroforming. As the feature size approaches sub-100 nm, there is an urgent need for fast reliable and cost effective nano-lithography. Nano-imprint lithography, developed in recent years has shown promise in meeting this need. Nano-imprint lithography creates pattern in a thermoplastic resist layer by hot embossing a rigid mold with a negative image of the desired pattern, such as a nickel stamper, into the resist. The embossing process creates a thickness contrast between the crests and troughs of the pattern. Most of the work in this field has been done using poly(methyl methacrylate) (PMMA) as the resist material.

Figure 1A:
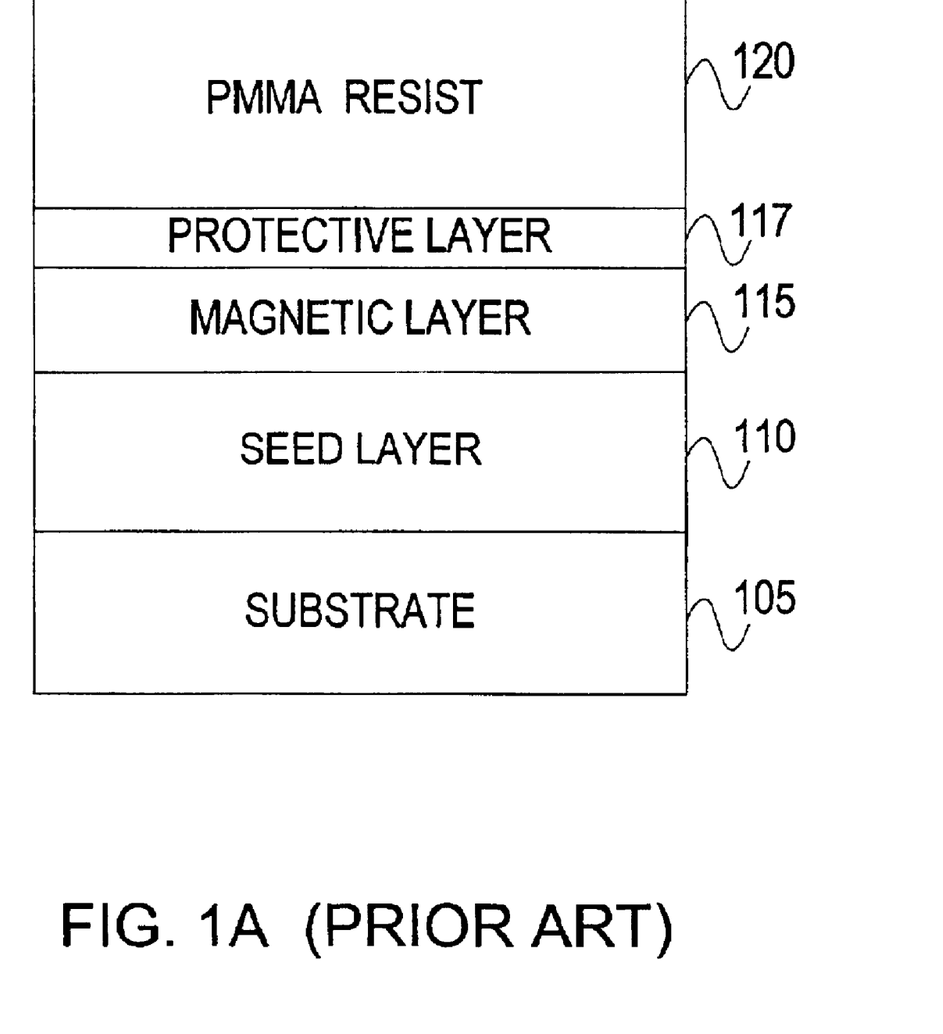
FIG. 1A is a block diagram showing a prior art conventional magnetic media structure covered with resist.

Conventional methods of making patterned media with nano-imprint lithography use PMMA as a resist. FIG. 1A is an illustration showing the layers of a conventional magnetic media structure overlaid with resist and ready for patterning. Conventional magnetic media structure includes a substrate 105, seed layer 110, a magnetic layer 115 and a protective layer 117. The resist used to overlay the conventional magnetic media includes a PMMA resist layer 120. The first layer of the media structure is the substrate 105, which is typically made of nickel-phosphorous plated aluminum or glass that has been textured. The seed layer 110, typically made of chromium, is a thin film that is deposited onto the substrate 105 creating an interface of intermixed substrate layer 105 and seed layer 110 molecules. The magnetic layer 115, typically made of a magnetic alloy containing cobalt (Co), platinum (Pt) and chromium (Cr), is a thin film deposited on top of the seed layer 110 creating a second interface of intermixed seed layer 110 molecules and magnetic layer 115 molecules between the two. The protective layer 117, typically made of carbon or diamond like carbon (DLC) is a thin film deposited on top of the magnetic layer 115 creating a third interface of intermixed magnetic layer 115 molecules and protective layer 117 molecules. Finally the resist layer 120, typically made of PMMA, is deposited on top of the protective layer 117 using spin-coating techniques.

Figure 1B:
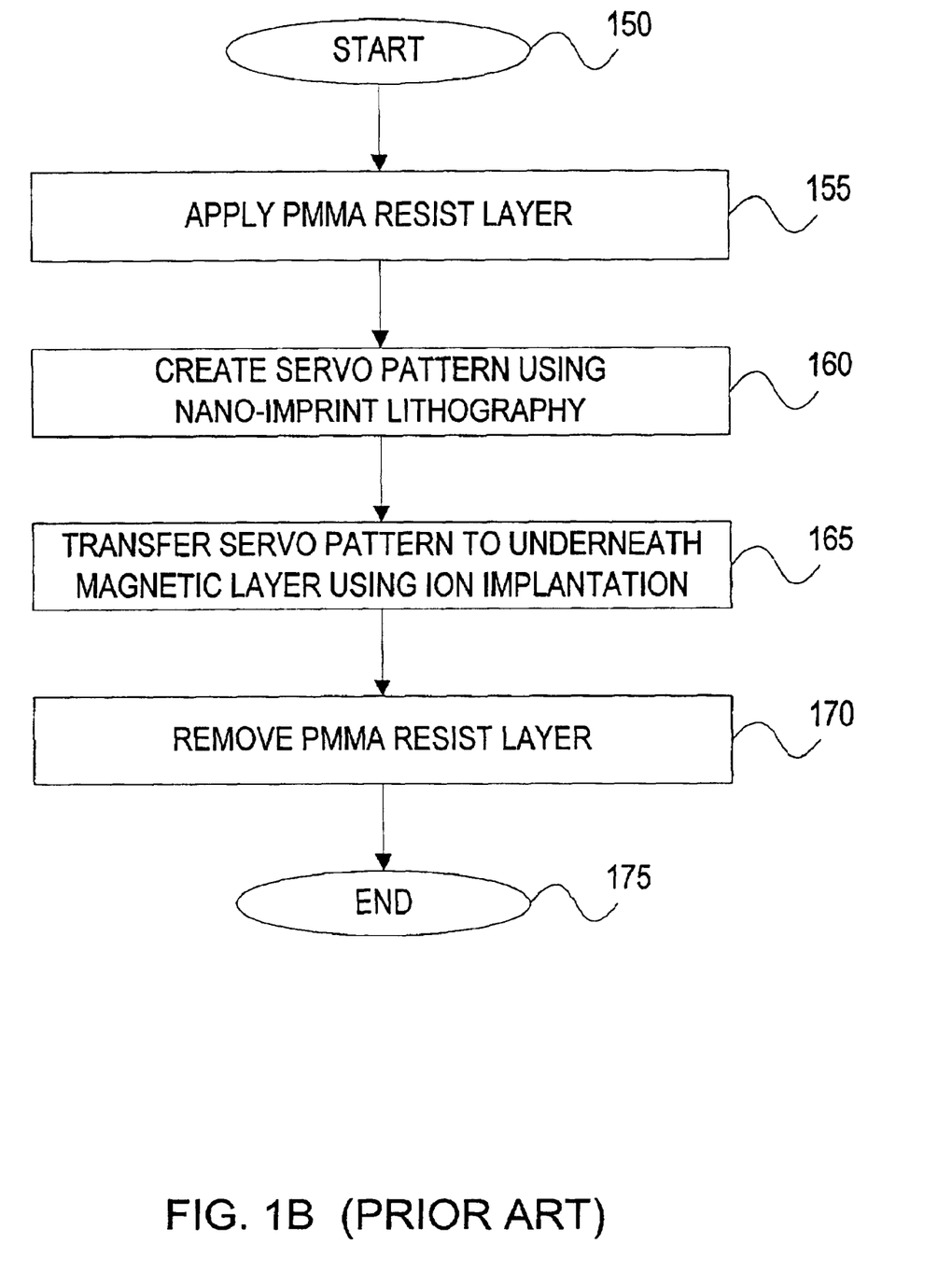
FIG. 1B is a flowchart illustrating the prior art method of using PMMA resist for nano-imprint lithography and subsequent ion implantation for servo pattern media.

FIG. 1B is a flow chart showing the typical steps used for nano-imprint lithography and subsequent ion implantation for servo pattern media with PMMA as a resist. The process begins with step 150 by transferring a partially complete media with substrate 105, seed layer 110, magnetic layer 115 and protective layer 117 to a conventional resist application station. In step 155, a PMMA resist layer is applied using a conventional spin-coating technique. In a spin coating technique, the PMMA resist is dropped on to the disk as the disk spins and gets spread out over the surface of the disk by the centrifugal force on the liquid as the disk spins. Temperature, speed of spinning and time are typically used to adjust the coating uniformity across the disk.

Next in step 160, conventional nano-imprint lithography is used to create a servo pattern on the resist layer. Conventional nano-imprint lithography creates patterns in a thermoplastic PMMA resist layer by hot embossing a rigid mold with a negative image of the desired pattern, such as a nickel stamper, into the resist. The pattern produced on the PMMA creates a thickness contrast.

Next in step 165, ion implantation is used to transfer the servo pattern to the underneath magnetic layer. By using the patterned resist layer as a mask the pattern embossed on the PMMA in step 160 is transferred to the underneath magnetic layer by ion implantation. The ion implantation produces magnetic properties difference, such as coercivity (Hc) and (remnant moment×thickness) (Mrt), between the protected and unprotected area. Ion beam irradiation reduces the Hc and Mrt by damaging the magnetic layer structure and consequently generates a magnetic pattern on the magnetic layer identical to the pattern on the resist layer. The protective layer 117, which separates the magnetic layer 115 from the resist layer 120, is not affected significantly to impact conventional processes.

After the pattern has been transferred to the magnetic layer 115 the PMMA resist 120 is removed in step 170 using conventional PMMA removal processes such as oxygen plasma etching. Since the oxygen plasma etching process removes organics, both the PMMA resist and the carbon protective layer 117 are removed in step 170. Finally in step 175 the patterned magnetic media is transferred to the next manufacturing operation, which typically includes re-depositing protective layer 117 and lubricating the disk.

This method of producing servo pattern media with nano-imprint lithography and subsequent ion implantation is unreliable as is further discussed with reference to FIGS. 1C and 1D, below.

Figure 1C:
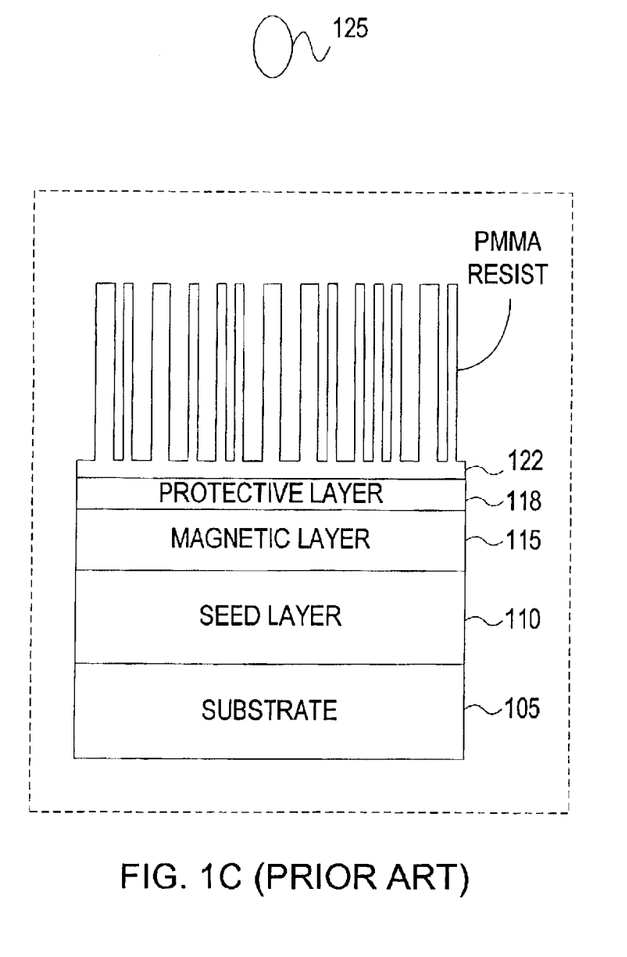
FIG. 1C is an illustrating showing the conventional magnetic media structure covered with patterned PMMA resist before ion implantation.
Figure 1D:
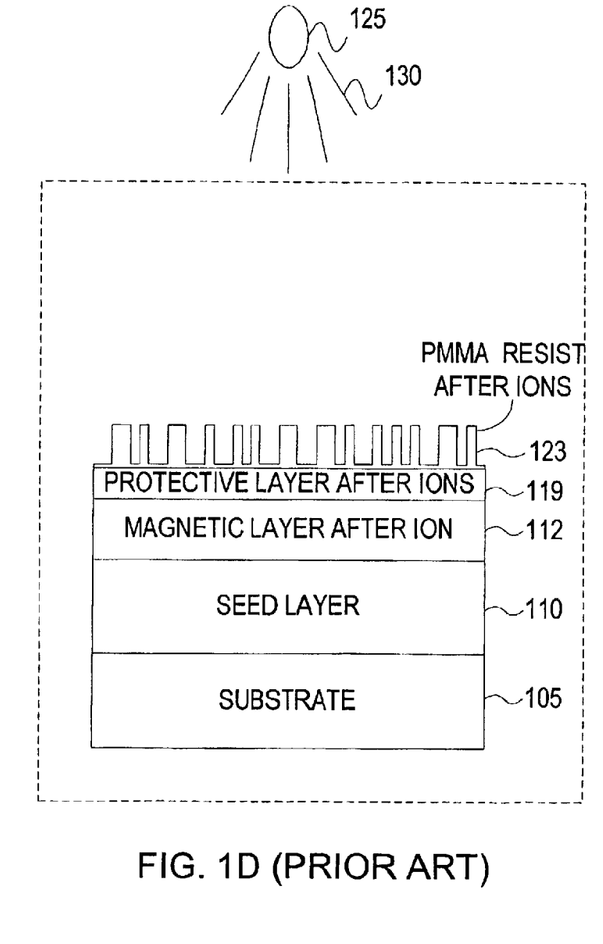
FIG. 1D is an illustrating showing the conventional magnetic media structure covered with patterned PMMA resist after ion implantation.

FIG. 1C shows the magnetic media stack with a PMMA resist layer, before being exposed to ions, while FIG. 1D shows the magnetic media stack with a PMMA resist layer, after being exposed to ions. FIG. 1C includes the magnetic media structure with PMMA resist having a substrate 105, seed layer 110, a magnetic layer 115, a protective layer 117 and stamped PMMA resist 122 as well as an ion source 125. FIG. 1D includes the substrate 105, the seed layer 110, a magnetic layer after ion implantation 112, a protective layer after ion implantation 119, a PMMA resist after ion implantation 123 as well the ion source 125 and ions 130. A comparison of FIGS. 1C and 1D shows a reduction in thickness of the PMMA resist caused by ion implantation. The reduction of the PMMA thickness during ion implantation affects the magnetic properties of the entire magnetic disk instead of just the portion of the disk designated according to the pattern on the resist.

FIG. 1C shows the magnetic media stack with the PMMA nano-imprinted resist layer waiting to be ion implanted. FIG. 1D shows an altered magnetic media stack, after undergoing ion implantation, having an altered magnetic layer after ion implantation 112, an altered protective layer after ion implantation 119 and an altered PMMA nano-imprinted resist layer ion implantation 123. Ion implantation decomposes the PMMA resist 122 and reduces its thickness by as much as 75 percent as shown by comparing the PMMA resist after ion implantation 123 with the PMMA resist before ion implantation 122. Additionally, ion implantation damages the magnetic layer 115, transforming the magnetic layer 115 into a different magnetic layer 112 having different magnetic properties including reduced coercivity (Hc). Although the intention is to use ion implantation to alter the magnetic layer according to the nano-imprint pattern, the ion implantation alters the entire magnetic layer reducing the Hc of the entire layer. The poor ion stopping effectiveness of the PMMA resist 120 along with its reduction in thickness when exposed to ions is the cause for the damage that ion implantation has on the magnetic properties of the magnetic layer.

Therefore what is needed is a system and method which overcomes these problems and makes it possible to use nano-imprint lithography and subsequent ion implantation to reliably create servo pattern media. Additionally, a system and method, which only alters the properties of the magnetic media according to a predetermined and defined pattern, is needed.

SUMMARY OF THE INVENTION

This limitation is overcome by using Polystyrene as a resist material for nano-imprint lithography and subsequent ion implantation for servo pattern media.

Polystyrene, which is deposited over a magnetic media, is first stamped with a stamper that creates a nano-imprint pattern on the polystyrene. The pattern consists of thinner and thicker regions of polystyrene, which are the negative image of the stamp pattern, over the magnetic media. The patterned structure is then exposed to ions. Since polystyrene has excellent ion stopping properties, the thicker polystyrene stops the incoming ions. However, the thinner portions of the stamped polystyrene surface is incapable of stopping the incoming ions because it is too thin and consequently allows the ions to pass through to the magnetic layer. Since the ions penetrate through the polystyrene layer and the protective layer to the magnetic layer according to the stamped pattern, the same stamped pattern is reproduced on the magnetic layer in the form of reduced coercivity (Hc) and reduced Mrt.

The present invention also can be implemented as a computer-readable program storage device which tangibly embodies a program of instructions executable by a computer system to perform a system method. In addition, the invention also can be implemented as a system itself.

These and various other features as well as advantages which characterize the present invention will be apparent upon reading of the following detailed description and review of the associated drawings.

BRIEF DESCRIPTION OF THE INVENTION

DETAILED DESCRIPTION OF THE PREFERRED EMBODIMENTS

The invention provides a system and method for nano-imprint lithography and subsequent ion implantation for servo pattern media.

Figure 2:
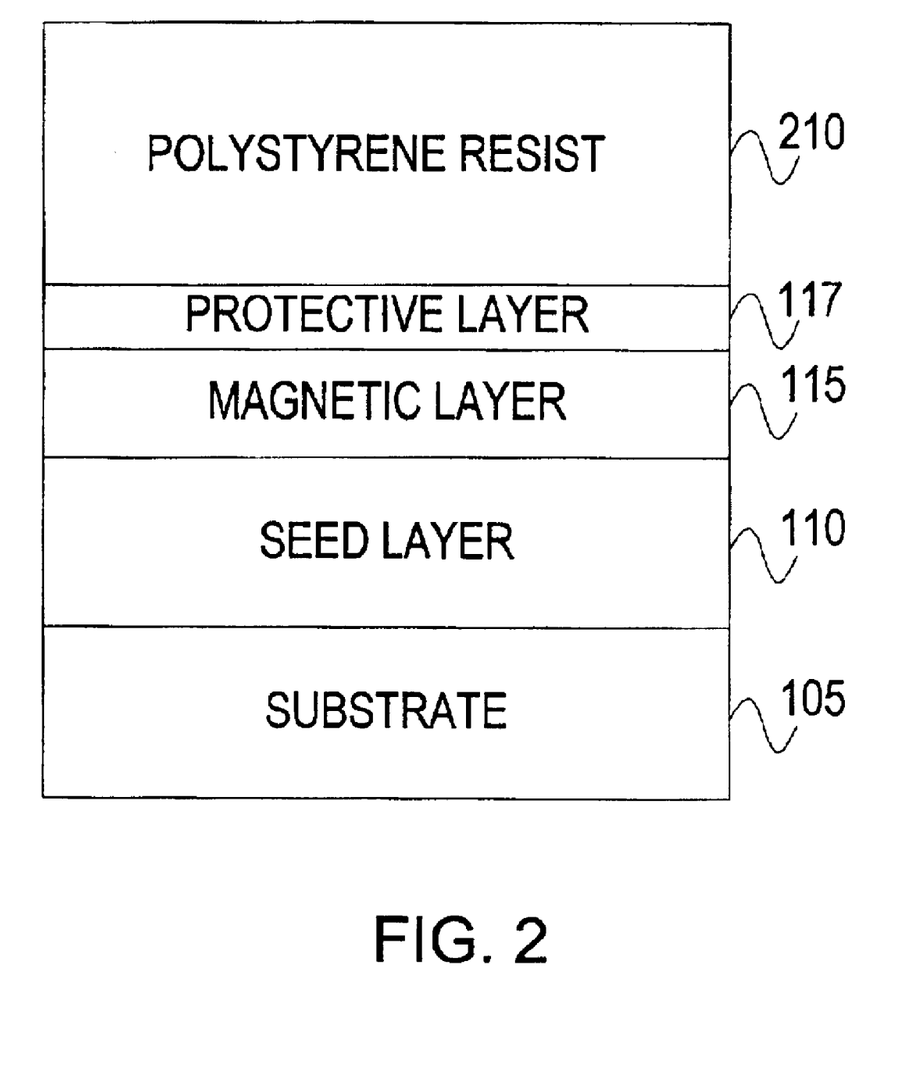
FIG. 2 is a block diagram showing the polystyrene layer in a magnetic media environment in accordance with an embodiment of the invention.

FIG. 2 is a block diagram showing a magnetic medium, ready for patterning, having a substrate 105, a seed layer 110, a magnetic layer 115, a protective layer 117 and a polystyrene resist layer 210. Polystyrene resist layer 210 overlays the protective layer 117 in accordance with one embodiment of the invention. Although the preferred embodiment is described using polystyrene as the thermoplastic resist material, the invention is not limited to polystyrene. Other forms of polymers, can any styrene co-polymers, can also be used as a thermoplastic resist material. The resist materials used in the preferred embodiment all have thermoplastic properties.

Although, the preferred embodiment of FIG. 2 shows the seed layer 110 deposited between the substrate 105 and the magnetic layer 115 the invention is not dependent on the presence of the seed layer 110. Since the purpose of the seed layer is to define the structure of the magnetic layer 115, which is deposited on of it, it may be advantages to leave out the seed layer 110 and deposit the magnetic layer 115 directly on top of the substrate 105, in some cases. Additionally, the magnetic layer 115 can consist of more than just a single layer such as CoCrPt. For example, in another embodiment the magnetic layer 115 may consist of a series of magnetic layers separated by buffers such as chromium.

Figure 3:
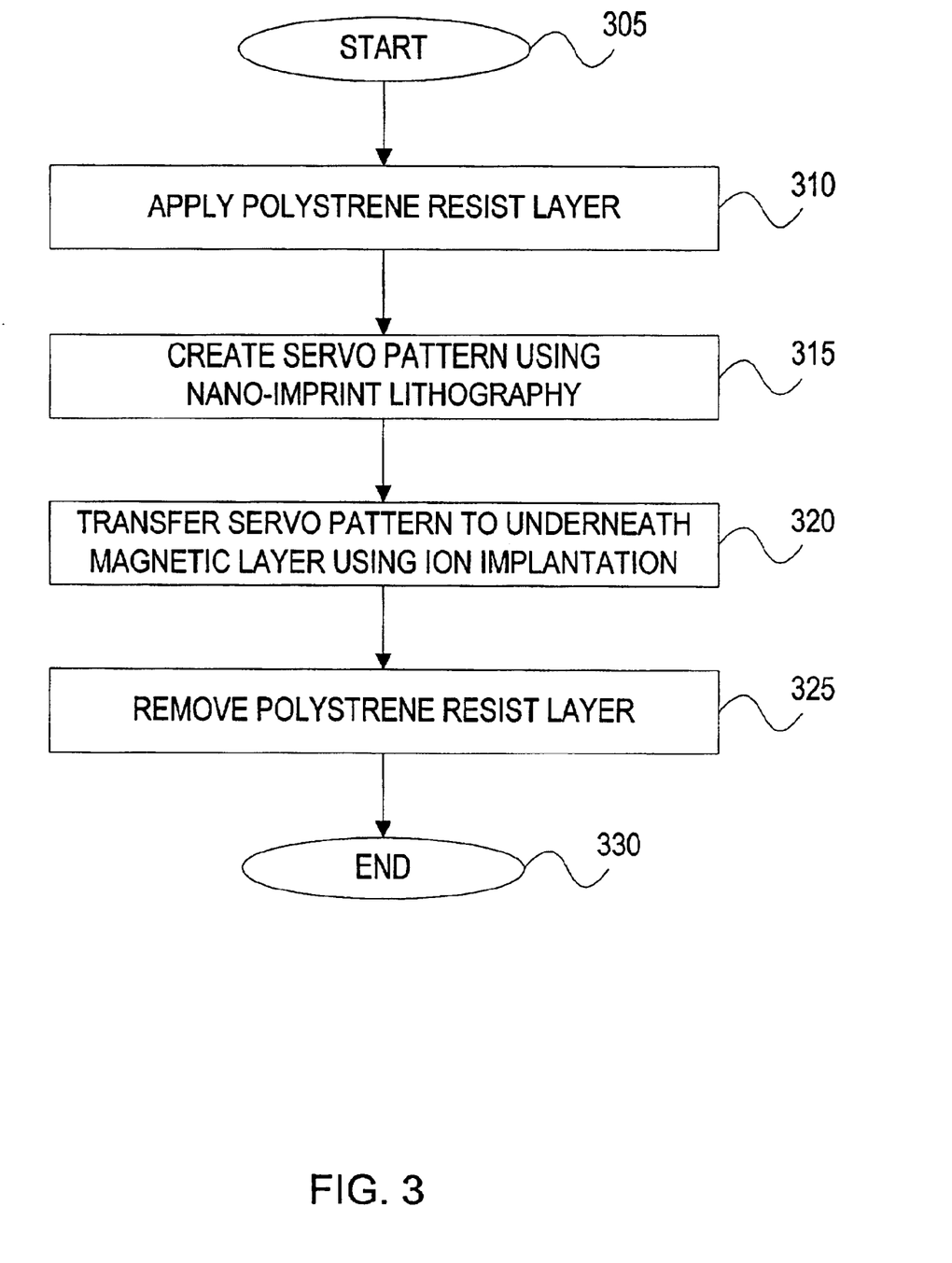
FIG. 3 is a flowchart showing the preferred method of using polystyrene in conjunction with nano-imprint lithography and subsequent ion implantation to create servo pattern media in accordance with an embodiment of the invention.

FIG. 3 is a flow chart showing the preferred steps used to make servo pattern media using polystyrene resist 210, nano-imprint lithography and subsequent ion implantation. The process begins with step 305 by transferring a ready for patterning magnetic medium having substrate 105, seed layer 110, magnetic layer 115 and protective layer 117 into a conventional resist spin coating apparatus such as a spin coater built by SUSS MicroTec Inc. (228 SUSS Dr., Waterbury Center, Vt. 05677.)

Next in step 310, conventional spin-coating techniques are used to spin-coat polystyrene 210 onto the magnetic medium. Polystyrene 210 is spin-coated onto the magnetic medium by applying a mixture of polystyrene and a solvent onto the magnetic medium and spinning the magnetic medium at a high rate. Typically, a conventional solvent, such as methoxybenzene, benzene, toluene or metaletherketone, is mixed in with the polystyrene. Although there are no restrictions on the revolutions per minute (rpm) that the disk should be spun, it is typically spun at approximately 3000 rpm.

Next in step 315 a servo pattern is created on the polystyrene layer 210, using nano-imprint lithography. Nano-imprint lithography creates patterns in the polystyrene resist layer 210 by hot embossing a rigid mold, having a desired pattern, into the polystyrene resist layer 210 as is further discussed with reference to FIG. 4B below. This creates a thickness contrast pattern on top of the polystyrene resist layer 210. In the preferred embodiment, a nickel stamper imprints the polystyrene resist layer at temperatures of approximately 135° C. The nickel stamper is then separated from the polystyrene at temperatures of approximately 115° C.

Next in step 320 the stamped pattern is transferred to the underneath magnetic layer 115, using ion implantation. During ion implantation, ions are accelerated towards the top of the polystyrene resist layer 210 using an ion source as is further discussed with reference to FIG. 4B below. The ions can be ionized molecules or atoms, such as argon, nitrogen, helium and chromium. The patterned polystyrene resist layer 210 acts as a mask stopping the ions which hit the thicker part of the polystyrene resist layer 210 and allowing ions which hit the thinner part of the polystyrene resist layer 210 to pass through to the underneath magnetic layer 115. The ion implantation produces magnetic properties differences, such as coercivity (Hc) and (remnant moment x thickness) (Mrt), between the protected and unprotected areas. Ion beam irradiation reduces the Hc and Mrt by damaging the magnetic layer 115 structure. Consequently a magnetic pattern, identical to the pattern on the stamped polystyrene resist layer 210, is generated on the magnetic layer 115. There are many possible ion energies and dosages which can be used for ion implantation. For example, in one embodiment ion implantation is done using an ion energy of 30 KeV and an ion dosage of $3 \times 10^{15}$ ions/cm$^2$, while in another embodiment ion implantation is done using an ion energy of 21 KeV and an ion dosage of $5 \times 10^{15}$ ions/cm$^2$. The invention is not limited to any particular ion energy or ion dosage.

Next in step 325 the polystyrene resist layer is removed from the magnetic media structure leaving the servo pattern in the underlying magnetic layer. Polystyrene resist is removed using a conventional oxygen plasma etch process similar to that used for removing conventional PMMA resist. Since the oxygen plasma etching process removes organics, both the polystyrene resist and the carbon protective layer 117 are removed in step 325. Step 325 can be adjusted to completely remove all of the polystyrene and protective layer 117 or it can be adjusted to leave a small amount of protective layer 117. Those skilled in the art will recognize that this is accomplished by determining the etch rate of the combination of polystyrene and protective layer 117 and setting the etching time to be less than the time needed to completely etch away all of the polystyrene and protective layer 117. Finally in step 375 the patterned magnetic media is transferred to the next manufacturing operation, which typically includes re-depositing protective layer 117 and lubricating the disk.

Figure 4A:
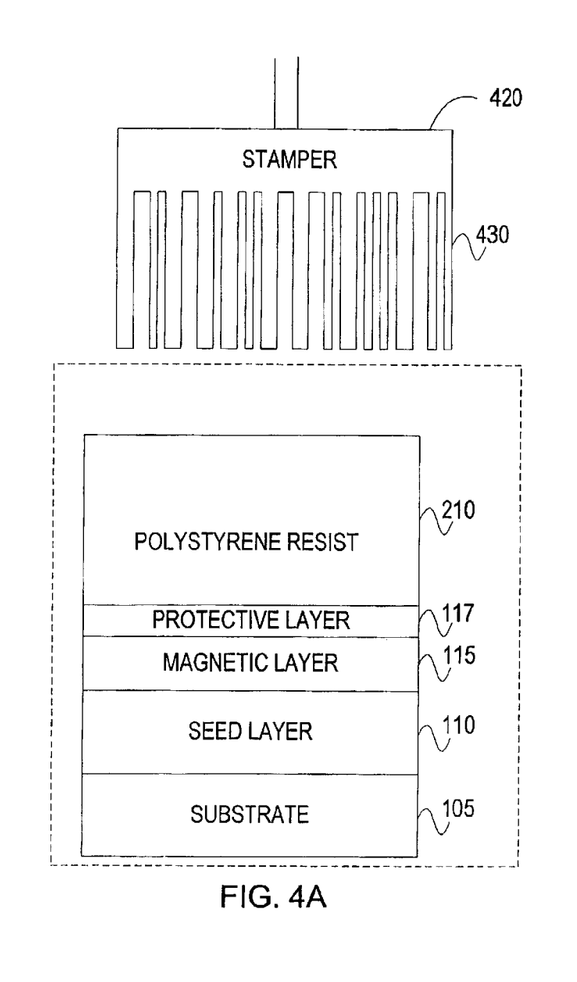
FIG. 4A is an illustration showing the conventional magnetic media structure covered with polystyrene before being patterned with a stamper.

FIG. 4A shows a magnetic media, which includes a substrate 105, a seed layer 110, a magnetic layer 115 and a protective layer 117 covered with the polystyrene resist layer 210, ready to be nano-imprinted with a stamper 420, in accordance with one embodiment of the invention. Stamper 420 is made of nickel and has a pattern 430 whose negative image is transferred onto the polystyrene resist layer 210 by pressing the stamper 420 into the polystyrene resist layer 210. In one embodiment the imprinting is done by holding stamper 420 at 135° C. and pressing it onto the polystyrene resist layer 210. After the image has been imprinted onto the polystyrene, the stamper is separated from the polystyrene resist layer 210 at 115° C. leaving an imprint on the polystyrene as shown in FIG. 4B.

Figure 4B:
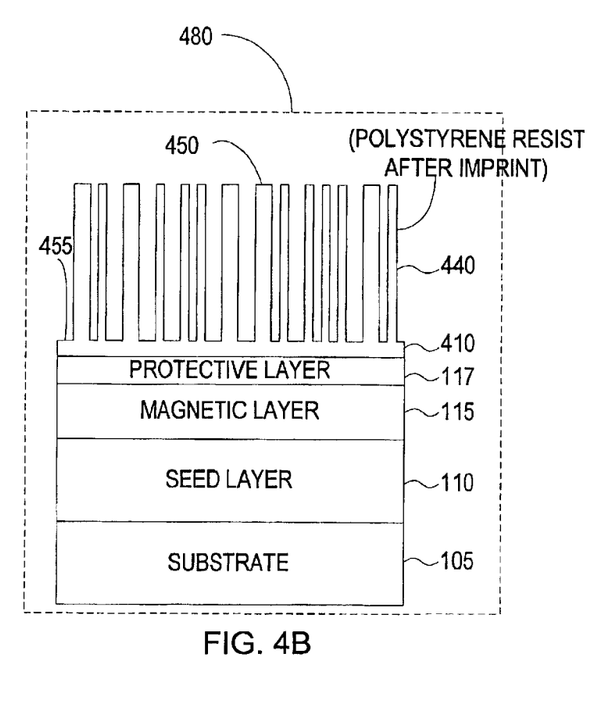
FIG. 4B is an illustrating showing the conventional magnetic media structure covered with polystyrene after being patterned with a stamper.

FIG. 4B is an illustration of the magnetic media with a polystyrene resist layer after it has been imprinted. The patterned polystyrene magnetic media 480 includes a substrate 105, a seed layer 110, a magnetic layer 115, a protective layer 117, a polystyrene resist layer after imprinting 410 and a nano-imprinted pattern 440 on the polystyrene resist film in accordance with one embodiment of the invention. The imprinting creates a thickness contrast in the polystyrene pattern 440 that follows the negative image of the nano-imprinted pattern 430 of the stamper 420. The thicker polystyrene resist 450 blocks ions during the ion implantation process whereas the thinner polystyrene pattern 455 permits the transmission of ions through the protective layer 117 to the magnetic under layer 115 as is further discussed with reference to FIG. 5B below. The thinner polystyrene pattern 455 can be as thin as the residue layer left over after stamper 420 has been pressed down as far as possible without damaging the protective layer 117.

Figure 5A:
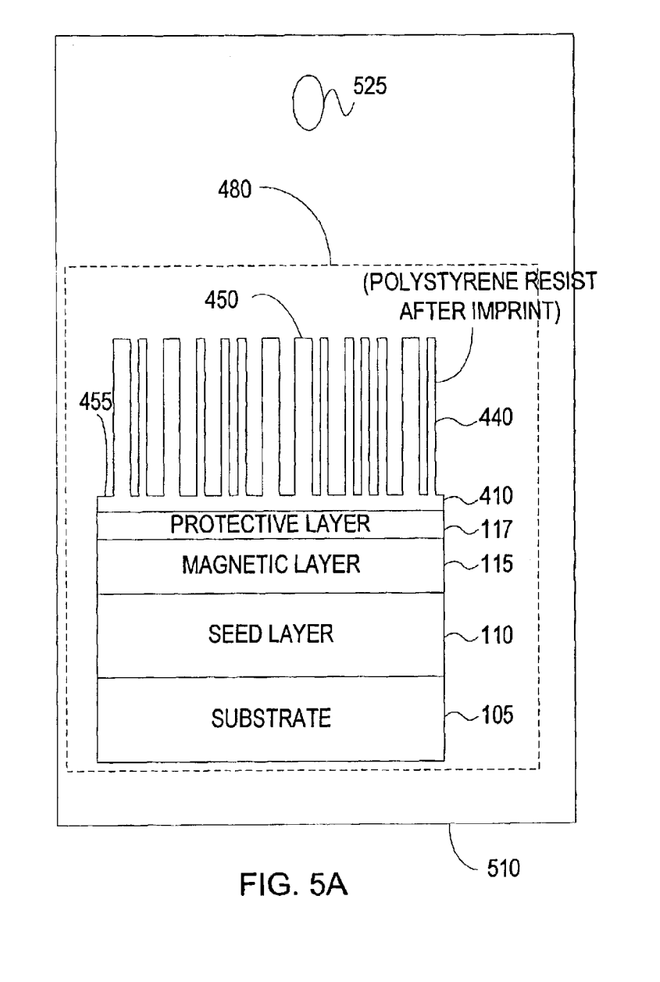
FIG. 5A is an illustrating showing the conventional magnetic media structure covered with patterned polystyrene before ion implantation.

FIG. 5A shows the patterned polystyrene covered magnetic media 480 of FIG. 4B, which includes a substrate 105, a seed layer 110, a magnetic layer 115, a protective layer 117, a polystyrene resist layer after imprinting 410, a nano-imprinted pattern 440, thick polystyrene resist 450 and thin polystyrene resist 455, ready to undergo ion implantation. Patterned polystyrene covered magnetic media 480 is in chamber 510 with an ion source 525 ready to be ion implanted. FIG. 5A is positioned next to FIG. 5B, which shows the patterned polystyrene covered magnetic media 480 of FIG. 4B undergoing ion implantation.

Figure 5B:
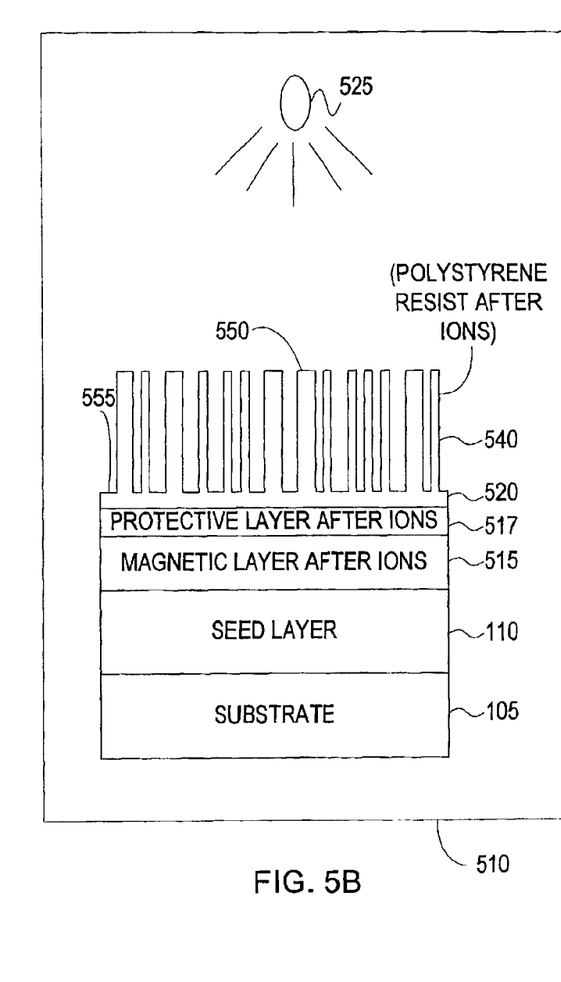
FIG. 5B is an illustrating showing the conventional magnetic media structure covered with patterned polystyrene after ion implantation.

FIG. 5B includes the substrate 105, the seed layer 110, a magnetic layer after ion implantation 515, a protective layer after ion implantation 517, a polystyrene resist after ion implantation 520, an ion source 525, ions 530, a nano-imprinted pattern after ion implantation 540, thick polystyrene resist after ion implantation 550 and thin polystyrene resist after ion implantation 555. The magnetic layer after ion implantation 515 differs from the magnetic layer 115, before ion implantation, in that its magnetic properties, including coercivity (Hc), have been altered according to the nano-imprinted pattern 540. Typically, the portions of the magnetic layer 515, which has been exposed to ions 530, have lower coercivity than those portions of the magnetic layer 515 that have not been exposed to ions 530. Ions 530, which are ejected from the ion source 525 and are accelerated towards the patterned polystyrene surface, penetrate the thinner portions 555 of stamped polystyrene surface, reach the magnetic layer 115, react with the magnetic layer 115 and alter the magnetic layer 115 transforming it into a different magnetic layer 515. Since thicker polystyrene 550 prevents ions from penetrating through to the magnetic layer 515 while the thinner polystyrene 555 permits the transmission of ions 530, the patterned polystyrene 540 prevents the magnetic layer 515 from being altered in areas other than those designated by the stamped nano-imprinted pattern 540. Therefore, a pattern of high and low coercivity is produced on the magnetic layer 515, which matches the stamped polystyrene pattern 540.

Protective layer 117 changes into protective layer 517 during the ion implantation process. Since the changes in protective layer 117 do not effect the overall performance of the magnetic media a detailed discussion of its changes are omitted.

Additionally, the ion implantation decomposes the polystyrene resist 520 and 540 and reduces its thickness by about 25 percent as shown by comparing the thickness of the polystyrene in FIG. 5A before ion implantation to the thickness of the polystyrene in FIG. 5B after ion implantation. This reduction in the polystyrene thickness is much less than occurs to PMMA resist 120 under the same ion implantation conditions as was discussed with reference to FIG. 1C. Consequently the magnetic layer after ion implantation 515 covered by polystyrene 520 and 540 is altered only according to the polystyrene stamped pattern 540 whereas the magnetic layer 115 covered with protective layer 117 and PMMA 120 is entirely altered reducing the Hc and Mrt of the entire magnetic layer.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

We claim:

1. A method of making patterned medium, comprising the steps of:
    using a patterned thermoplastic polymer having a pattern, deposited over a magnetic medium, as a mask;
    exposing said patterned thermoplastic polymer to ions which penetrate the polymer according to said pattern and patterning a magnetic layer; and
    wherein said thermoplastic polymer comprises polystyrene.

2. The method of claim 1 wherein said thermoplastic polymer is styrene co-polymers.

3. The method of claim 1 wherein the step of using a patterned thermoplastic polymer having a pattern further comprises depositing a polymer over a magnetic layer and patterning said polymer with said pattern with a stamper.

4. A method for patterning magnetic medium, comprising the steps of:
    coating a thermoplastic polymer material on a magnetic medium to make a resist film, said thermoplastic polymer comprises polystyrene;
    patterning said thermoplastic polymer layer according to a predetermined pattern;
    altering magnetic properties of said magnetic medium according to said pattern by exposing the thermoplastic polymer, after patterning, to ions which penetrate said thermoplastic polymer layer according to said pattern; and
    removing said thermoplastic polymer layer leaving said pattern on said magnetic medium.

5. The method of claim 4 wherein said thermoplastic polymer is styrene co-polymers.

6. The method of claim 4 wherein the step of patterning further includes stamping the thermoplastic polymer with a stamper having a negative image of said pattern.

7. The method of claim 4 wherein said ions is a molecule.

8. The method of claim 4 wherein said magnetic medium comprises;
    a substrate;
    a seed layer for controlling growth of additional layers;
    a magnetic layer for storing data; and
    a protective overcoat.

9. The method of claim 4 where in said magnetic medium is a magnetic layer.

10. A system for making patterned magnetic medium, comprising;
    a substrate;
    a magnetic layer deposited on said substrate for patterning according to a pattern;
    a thermoplastic polymer layer deposited over said magnetic layer, said thermoplastic polymer layer having said pattern acting as a mask that blocks incoming ions according to said pattern; and
    wherein said thermoplastic polymer comprises polystyrene.

11. The system of claim 10 wherein said thermoplastic polymer layer is styrene co-polymers.

12. The system of claim 10 wherein said magnetic layer is a plurality of magnetic layers.

13. The system of claim 10 further comprising a protective overcoat that is deposited between said magnetic layer and said thermoplastic polymer layer.

14. The system of claim 10 further comprising a seed layer that is deposited between said substrate and said magnetic layer.

15. The system of claim 14 wherein said seed layer comprises chromium.

16. A method for patterning magnetic medium, comprising:
    means for coating a thermoplastic polymer layer material on a magnetic medium to make a resist film, said thermoplastic polymer comprises polystyrene;
    means for patterning said thermoplastic polymer layer according to a predetermined pattern;
    means for altering magnetic properties of said magnetic medium according to said pattern by exposing a patterned polymer surface to a plurality of ions which penetrate said polymer layer according to said pattern; and
    means for removing said thermoplastic polymer layer leaving said pattern on said magnetic medium.

17. The method for patterning magnetic medium of claim 16 wherein said means for patterning said thermoplastic polymer layer further includes stamping said predetermined patterned with a stamper.

* * * * *